United States Patent [19]

Miura

[11] Patent Number: 5,410,191
[45] Date of Patent: Apr. 25, 1995

[54] MONOSTABLE MULTIVIBRATOR

[75] Inventor: Katsunori Miura, Shijonawate, Japan

[73] Assignee: Sanyo Electric Co., Ltd., Osaka, Japan

[21] Appl. No.: 187,819

[22] Filed: Jan. 27, 1994

Related U.S. Application Data

[63] Continuation of Ser. No. 46,102, Apr. 6, 1993, abandoned, which is a continuation of Ser. No. 908,747, Jul. 6, 1992, abandoned, which is a continuation of Ser. No. 554,653, Jul. 19, 1990, abandoned.

[30] Foreign Application Priority Data

Jul. 20, 1989 [JP] Japan .................................. 1-187810

[51] Int. Cl.6 ............................................ H03K 3/284
[52] U.S. Cl. ...................................................... 327/227
[58] Field of Search ...................... 307/273, 272.1, 264; 331/1 A, 113 R

[56] References Cited

U.S. PATENT DOCUMENTS

| | | | |
|---|---|---|---|
| 2,987,632 | 6/1961 | Milford | 307/273 |
| 3,480,801 | 11/1969 | Smith | 307/273 |
| 3,484,624 | 12/1969 | Rasiel et al. | 307/362 |
| 3,497,725 | 2/1970 | Lorditch, Jr. | 307/273 |
| 3,742,257 | 6/1973 | Wittenzellmer | 307/273 |
| 3,820,029 | 6/1974 | McKinley | 307/273 |
| 3,829,716 | 8/1974 | Goyer | 307/273 |
| 4,092,605 | 5/1978 | Donnelly | 328/155 |
| 4,301,422 | 11/1981 | Minakuchi | 307/273 |
| 4,620,312 | 10/1986 | Yamashita | 307/273 |
| 4,775,811 | 10/1988 | Okano | 307/514 |
| 4,843,255 | 6/1989 | Stuebing | 307/273 |

FOREIGN PATENT DOCUMENTS

| | | | |
|---|---|---|---|
| 2544904 | 4/1984 | France . | |
| 266457 | 12/1987 | Germany . | |
| 0082532 | 6/1980 | Japan | 307/273 |
| 58084507 | 11/1981 | Japan . | |
| 60-80314 | 9/1985 | Japan . | |
| 0261917 | 10/1988 | Japan | 307/273 |
| 2162395 | 7/1985 | United Kingdom . | |

OTHER PUBLICATIONS

Orengo et al., "Monostable Circuit with Calibrated Width Pulses", IBM Tech. Disclosure Bulletin, vol. 25, No. 118, Apr. 1983, pp. 6181–6182.

Ward, "NAND Gates & UJT form Stable Hybird monostable", Electronic Design, Apr. 26, 1965, pp. 45–46.

Primary Examiner—Timothy P. Callahan
Assistant Examiner—Terry L. Englund
Attorney, Agent, or Firm—Nikaido, Marmelstein, Murray & Oram

[57] ABSTRACT

A monostable multivibrator is formed in a monolithic integrated circuit along with a voltage controlled oscillator (VCO). The VCO and the monostable multivibrator respectively includes capacitors. A center frequency of the VCO is controlled by a control signal from a low-pass filter which receives an output of a phase comparator. A current from a constant current source circuit is adjusted to be in proportion to a level of the control signal. The capacitor of the monostable multivibrator charged by the current is adjusted from the constant current source circuit in response to a trigger pulse. A period from a time when the charge is started to a time when a charged voltage of the capacitor reaches a predetermined value becomes a metastable period of the monostable multivibrator.

7 Claims, 8 Drawing Sheets

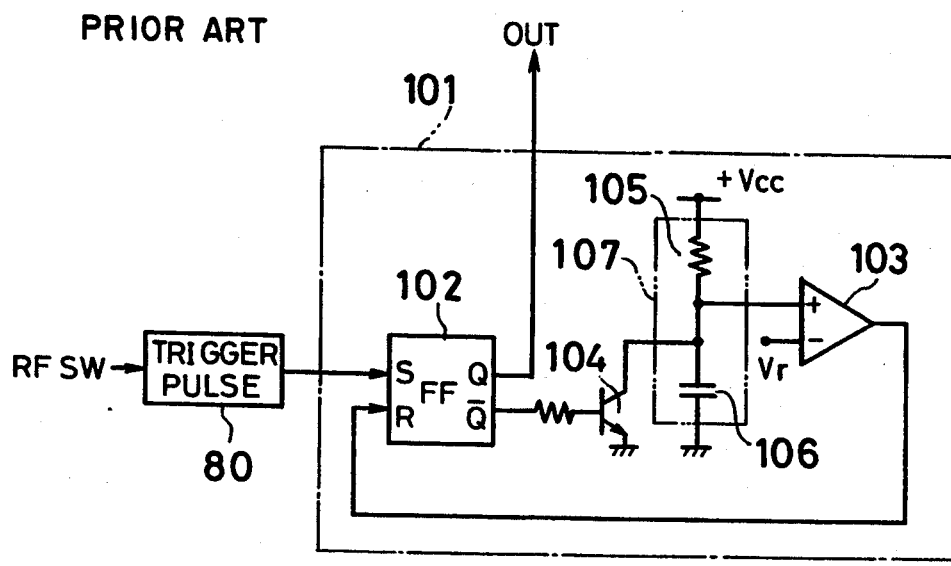

MONOSTABLE MULTIVIBRATOR

This application is a continuation of application Ser. No. 08/046,102 filed Apr. 6, 1993, which a a continuation of Ser. No. 07/908,747 filed on Jul. 6, 1992, which is a continuation of Ser. No. 07/554,653 filed on Jul. 19, 1990 which are all now abandoned.

BACKGROUND OF THE INVENTION

Field of the invention

The present invention relates to a monostable multivibrator. More specifically, the present invention relates to a monostable multivibrator which is used in a video or sound reproducing circuit in a VTR, for example, and formed in a monolithic integrated circuit (IC) along with a voltage controlled oscillator (VCO).

Description of the Prior Art

In a conventional VTR, especially in an 8 mm VTR, since spike noises occur in a demodulated output at a time point when two rotated video heads are changed and at a time point when a drop-out occurs, the demodulated output is processed by a holding circuit for holding a previous value. As disclosed in Japanese Utility Model Laid-open No. 62-205 [G11B5/027], a head changing noise can be eliminated by generating a pulse having a metastable period for a predetermined time period by a monostable multivibrator in response to a head changing pulse, that is, a so-called RF-SW pulse and by compensating the demodulated output by an output of holding circuit in the metastable period. As a monostable multivibrator used for such a purpose, a very high-accuracy one is required.

A circuit diagram of one example of the above described high-accuracy monostable multivibrator is shown in FIG. 2. In FIG. 2, a monostable multivibrator 101 includes an R-S flip-flop (RS-FF) 102, a comparator 103, a transistor 104, and a charge/discharge circuit 107 composed of a resistor 105 having a resistance value of R and a capacitor 106 having a capacitance value of C.

An RF SW pulse as shown in FIG. 3A is first input to a trigger pulse generating circuit 80 from which a trigger pulse as shown in FIG. 3B is generated at a leading edge and a trailing edge of the RF-SW pulse to be supplied to a set input S of the RS-FF 102.

Since an inverted output of the RS-FF 102 is supplied to a base of the transistor 104, the transistor 104 is turned-off synchronously with the trigger pulse.

The transistor 104 has an emitter connected to the ground and a collector connected to a connection point of the resistor 105 and the capacitor 106 which are connected in series between a voltage (+Vcc) line and the ground, and therefore, if the transistor 104 is turned-on, the capacitor 106 is not charged, but the capacitor 106 is brought into a charging state if the transistor 104 is turned-off.

Therefore, an input level of a + side of the comparator 103 which is connected to the connection point of the resistor 105 and the capacitor 106 is equal to a charged voltage of the capacitor 106, and the same gradually increases synchronously with the trigger pulse as shown in FIG. 3C. When the + side input level reaches a reference level Vr being applied to a − side input of the comparator 103, as shown in FIG. 3D, an output is generated from the comparator 103 to be supplied to a reset terminal of the RS-FF 102.

A non-inverted output of the RS-FF 102 is generated so as to have a pulse width of $\tau$ as shown in FIG. 3E, which becomes an output of the monostable multivibrator 101. Since the + side input level of the comparator 103 is equal to a charged voltage of the capacitor 106, the pulse width $\tau$ which is equal to a metastable period of the monostable multivibrator is given by the following equation (200).

$$\tau = -CR \ln(1 - Vr/Vcc) \qquad (200)$$

In the equation (200), the reference level Vr and the power source voltage Vcc are constant values, respectively. Therefore, Vr/Vcc is also a constant value, and the pulse width $\tau$ is dependent on the values of C and R.

In cases where a high-accuracy monostable multivibrator as described above is formed in a monolithic IC, it is impossible to form a CR circuit having a high-accuracy and good temperature characteristic. Therefore, a resistor and a capacitor for the charge/discharge circuit must be connected externally. In addition, a resistor and a capacitor normally have accuracies of ±5%. If higher accuracy is required, it is necessary to use a resistor and a capacitor extremely high in cost.

SUMMARY OF THE INVENTION

A principal object of the present invention is to provide a novel monostable multivibrator.

Another object of the present invention is to provide a monostable multivibrator having a metastable period with a high degree of accuracy.

The other object of the present invention is to provide a monostable multivibrator having good temperature characteristic without using high cost external components.

A monostable multivibrator in accordance with the present invention is formed in a monolithic integrated circuit along with another circuit including a first capacitor which is controlled by a control signal from a control circuit. The monostable multivibrator comprises: a constant current source; a capacitor; charge starting means for starting a charge of the capacitor by a current from the constant current source in response to a trigger signal; charge stopping means for stopping the charging of the capacitor when a charged voltage of the capacitor reaches a predetermined value; and current control means for controlling a current amount from the constant current source in response to a level of the control signal from the control circuit.

In accordance with the present invention, since the current amount of the constant current source which charges the capacitor of a monostable multivibrator is controlled in response to a level of the control signal, it is possible to obtain a monostable multivibrator having a metastable period with a high degree of accuracy. More specifically, the first capacitor included in another circuit and the capacitor included in the monostable multivibrator are formed in a single monolithic integrated circuit. On the other hand, in such a monolithic integrated circuit, the relative accuracy of the respective capacitors is very good. A capacitance value of the first capacitor can, for example, be varied by temperature. A capacitance value of the capacitor can be varied in the same direction as a varying direction of the capacitance value of the first capacitor. Therefore, when the charge current for the capacitor is controlled in response to the level of the control signal which compensate for variation in the capacitance value of the first capacitor, variation in the capacitance value of the capacitor can be similarly compensated. Therefore, the metastable period of the monostable multivibrator dependent on the charged voltage can also be also controlled with a high degree of accuracy.

The objects features, and advantages of the present invention will become more apparent from the following detailed description of the embodiments of the present invention when taken in conjunction with accompanying drawings.

BRIEF DESCRIPTION OF THE DRAWINGS

FIG. 2 is a circuit diagram showing one example of a conventional monostable multivibrator.

FIG. 3A-FIG. 3E are waveform diagrams showing an operation of a monostable multivibrator as shown in FIG. 2.

DETAIL DESCRIPTION OF THE PREFERRED EMBODIMENT

Figure 1:
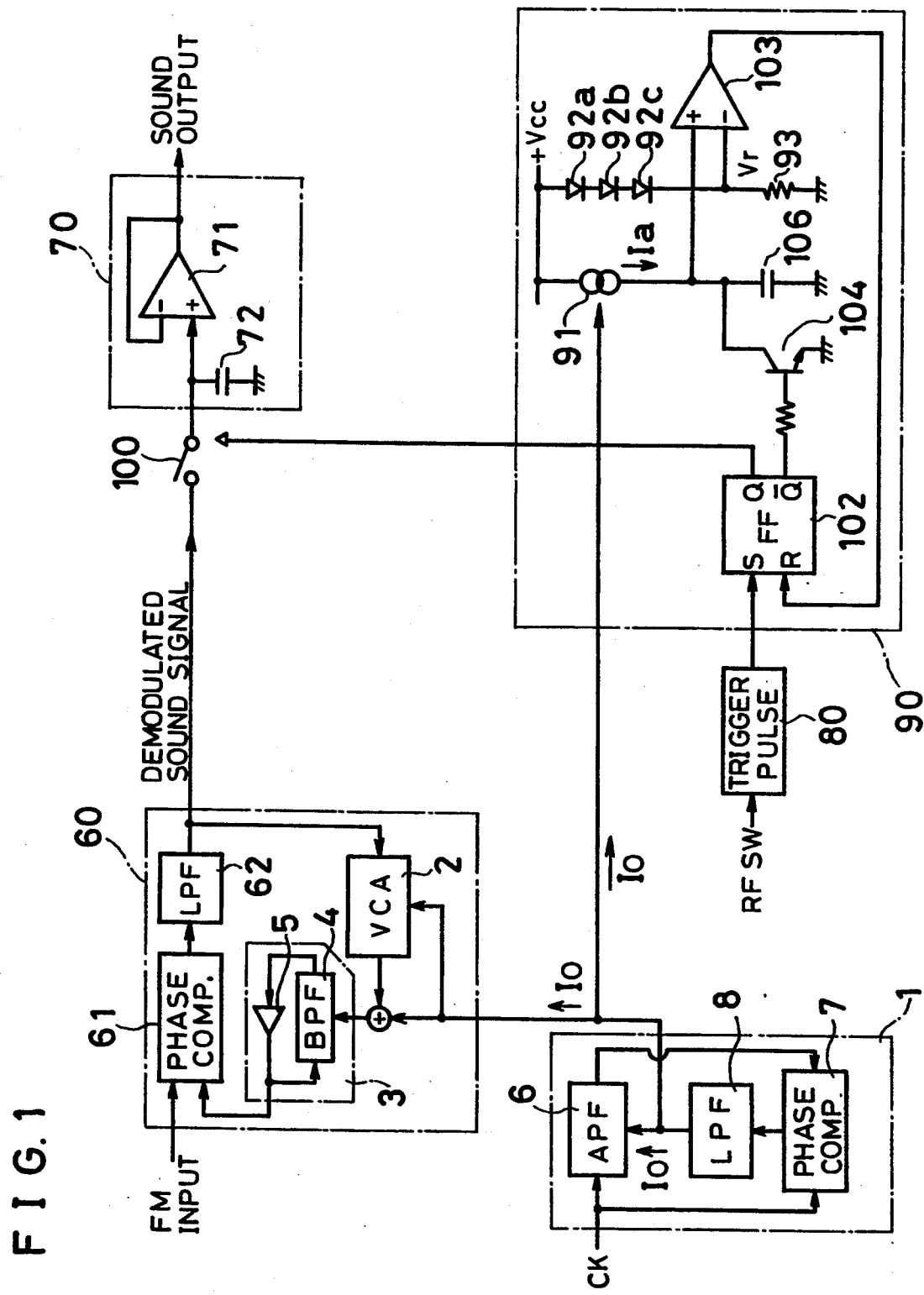
FIG. 1 is a circuit diagram showing one embodiment in accordance with the present invention of a center frequency control circuit.

FIG. 1 is a circuit diagram showing one embodiment in accordance with the present invention. A circuit shown in FIG. 1 includes a PLL FM demodulating circuit 60 which demodulates an FM input to output as a demodulated sound signal. A center frequency Fo of a VCO 3 included in the FM demodulating circuit 60 is controlled by a center frequency (Fo) control circuit 1. The sound signal from the FM demodulating circuit 60 is held by a hold circuit 70 for holding a previous signal level (hereinafter, simply called as "hold circuit"). A trigger pulse generating circuit 80 generates a trigger pulse at a leading edge and a trailing edge of an RF-SW pulse, and in response to the trigger pulse, a monostable multivibrator 90 generates an output having a constant metastable period. A switch 100 is opened or closed in response to the output of the monostable multivibrator 90 to control an input to the hold circuit 70 of the demodulated sound signal. All such components are formed in the same monolithic IC.

Next, descriptions of respective components shown in FIG. 1 will be made.

The PLL FM demodulating circuit 60 includes a VCO 3 which is constituted by a closed loop including a current controlled variable band-pass filter (hereinafter, simply called as "variable BPF") 4 and an amplifier 5 having a fixed gain more than 1 and the same phase. An oscillation output of the VCO 3 and an FM input signal are phase-compared with each other in a phase comparing circuit 61. An LPF 62 derives a low-frequency component from an output of the phase comparing circuit 61 and an output of the LPF 62 is received by a voltage controlled amplifier (VCA) which receives a control signal of an output current Io from the Fo control circuit 1. The variable BPF 4 is supplied with an added current of the current Io and an output current $\Delta i$ of the VCA 2 as a control current. A center frequency Fo of the variable BPF 4 is determined by the current Io and a frequency deviation amount $\Delta f$ is determined by the current $\Delta i$.

In addition, the Fo control circuit 1 includes a variable all-pass filter (hereinafter, simply called as "variable APF") 6 which receives a clock signal CK having a fixed frequency, a phase comparator 7 which performs a phase comparison of an input and an output of the variable APF 6, and a low-pass filter (LPF) 8 which receives an output of the phase comparator 7 and controls the variable APF 6 by an output thereof. As described above, if the variable APF 6 is controlled by the output of the LPF 8, that is, an error signal which is the output of the phase comparator 7, a resonant point of the variable APF 6 can be in proportion to a frequency of the clock signal CK. In addition, the phase comparator 7 outputs the error signal of zero when a phase difference between the input and the output of the variable APF 6 is zero. The clock signal CK may be generated by a crystal oscillator (not shown).

Figure 4:
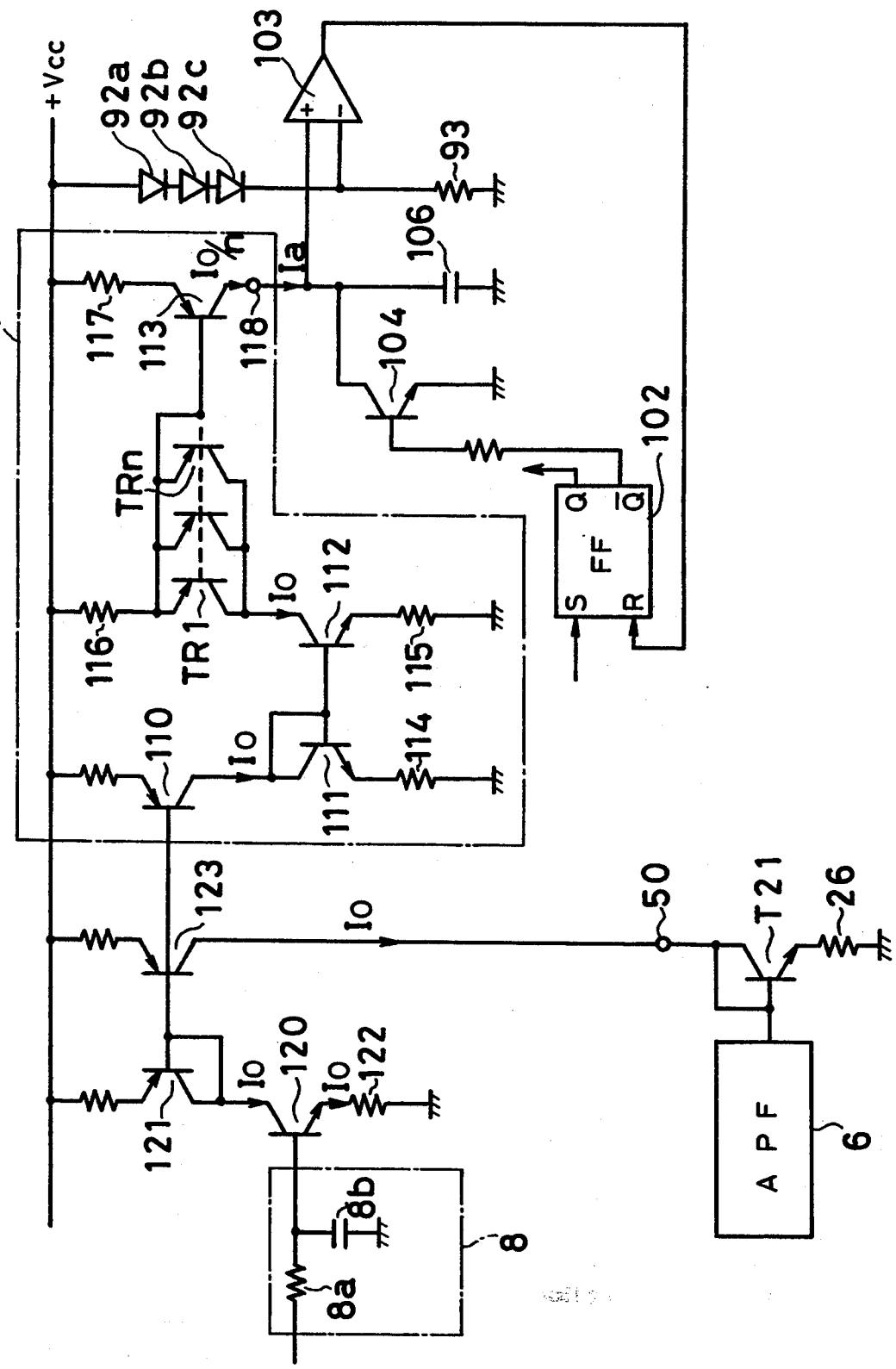
FIG. 4 is a circuit diagram showing a major portion of FIG. 1 embodiment in detail.

The variable APF 6 and the variable BPF 4 shown in FIG. 4 are formed in a single monolithic IC with the same circuit configuration, and more specifically, the same are constituted by utilizing a secondary variable filter which will be described later.

Then, with reference to FIG. 6, a secondary variable filter 20 which can operate as the variable BPF and the variable APF utilized in this embodiment shown will be described.

Figure 6:
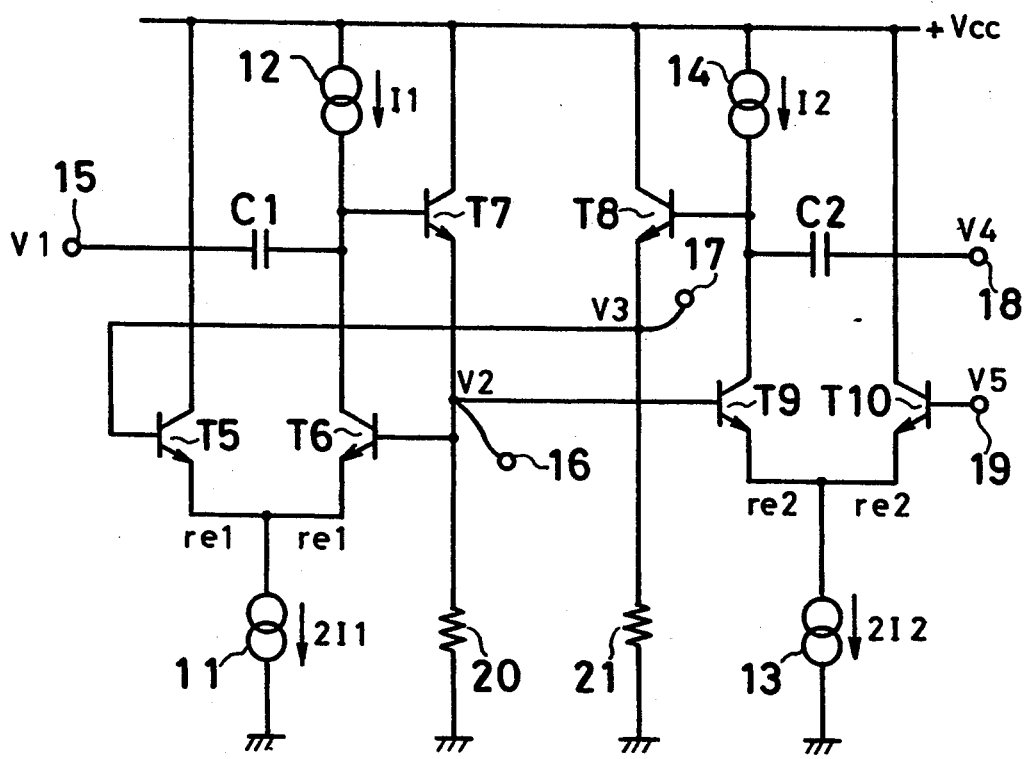
FIG. 6 is a circuit diagram showing one example of a variable filter capable of being used as a variable BPF and a variable APF as shown in FIG. 1.

FIG. 6 is a circuit diagram showing a principle of the variable filter. In FIG. 6, transistors T5 and T6 constitute a differential pair, and the emitters thereof are commonly connected to a constant current source circuit 11. The transistor T5 is supplied with the voltage +Vcc at a collector thereof, and a collector of the transistor T6 is connected to a constant current source circuit 12 and a base of a transistor T7 and to a terminal 15 through a capacitor C1. In addition, a current amount of the constant current source circuit 11 is set twice (2I1) a current amount I1 of the constant current source circuit 12.

Transistors T9 and T10 also constitute a differential pair, and the emitters thereof are commonly connected to a constant current source circuit 13. The transistor T10 is supplied with the voltage +Vcc at a collector thereof, and a collector of the transistor T9 is connected to a constant current source circuit 14 and a base of a transistor T8 and to a terminal 18 through a capacitor C2. In addition, a base of the transistor T10 is connected to a terminal 19. Furthermore, a current amount of the constant current source circuit 13 is set twice (2I2) a current amount I2 of the constant current circuit 14.

The transistor T7 is paired with the transistor T8 and the voltage +Vcc is applied to respective collectors thereof. In addition, an emitter of the transistor T7 is connected to bases of the transistors T6 and T9 and a terminal 16, and an emitter of the transistor T8 is connected to a base of the transistor T5 and a terminal 17.

In addition, V1, V2, V3, V4 and V5 respectively correspond to voltage values of signals at the terminals 15, 16, 17, 18 and 19.

As to the differential pairs respectively constituted by the transistors T5 and T6 and the transistors T9 and T10 of the variable filter 20 each having the above described configuration, the following equations (9) and (10) are established, respectively.

$$(V3 - V2)/2re1 = (V2 - V1)/\frac{1}{j\omega C1} \quad (9)$$

$$(V5 - V2)/2re2 = (V3 - V4)/\frac{1}{j\omega C2} \quad (10)$$

The principle why the equations (9) and (10) can be obtained will be described with reference to FIG. 8A—FIG. 8E.

Figure 8A:
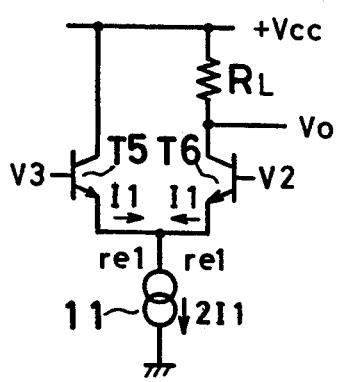
FIG. 8A-FIG. 8E are partial circuit diagrams showing an operational principle of FIG. 7 circuit.

First, noting a differential pair composed of transistors T5 and T6 as shown in FIG. 8A, in which a load resistor RL is used in place of the constant current source circuit 12, in accordance with characteristics of the differential pair, a collector voltage V0 of the transistor T6 is represented by the following equation (11).

$$V0 = gm \cdot RL \cdot (V3-V2) \quad (11)$$

where gm is a mutual conductance.

Assuming that a charge of an electron is q $(1.602 \times 10^{-19}$ C), Boltzmann's constant is K $(1.38 \times 10^{-23}$ J/K), and an absolute temperature is T, a relationship represented by the following equation (12) is established.

$$gm = \frac{q \cdot (2I1)}{4KT} = \frac{qI1}{2KT} \quad (12)$$

In addition, by using the differential resistor re1 $= KT/qI1 = \frac{1}{2}gm$, the above equation (11) can be modified as follows:

$$V0 = \frac{1}{2re1} \cdot RL \cdot (V3 - V2) \quad (13)$$

Figure 8C:
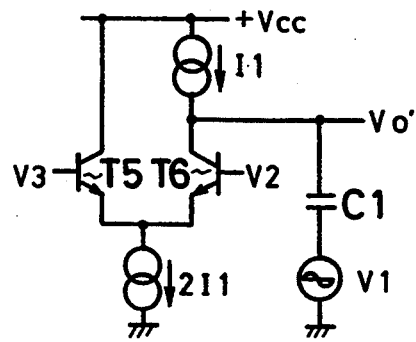
Figure 8D:
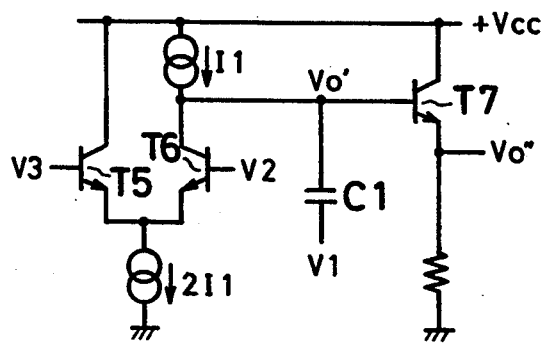
Figure 8B:
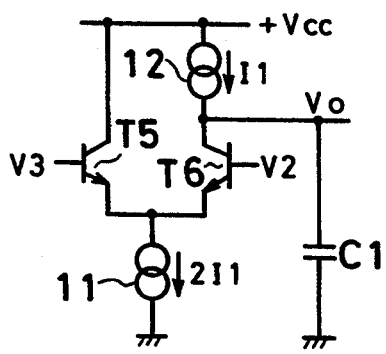

Next, as shown in FIG. 8B, if the load resistor RL is replaced with a constant current source circuit 12 having a current amount of I1 and a capacitor C1 is connected between a collector of the transistor T6 and the ground, since an impedance of the constant current source circuit 12 can be regarded as infinity and an impedance $1/j\omega C1$ is corresponding to the load resister RL, when the equation (13) is applied to FIG. 8B, the following equation (14) can be obtained.

$$V0 = \frac{1}{2re1} \cdot \frac{1}{j\omega C1} \cdot (V3 - V2) \quad (14)$$

Now, as shown in FIG. 8C, if an alternating current voltage source having an output voltage of V1 is further connected between the capacitor C1 and the ground, assuming that a collector voltage of the transistor T6 is V0', the following equation (15) is obtainable in accordance with the equation (14).

$$V0' = \frac{1}{2re1} \cdot \frac{1}{j\omega C1} \cdot (V3 - V2) + V1 \quad (15)$$

Next, as shown in FIG. 8D, when an emitter follower is constituted by a transistor T7, assuming that an emitter voltage of the transistor T7 is V0'', since the equation V0'=V0'' can be established in the emitter follower, the following equation (16) can be obtained in accordance with the equation (15).

$$V0'' = \frac{1}{2re1} \cdot \frac{1}{j\omega C1} \cdot (V3 - V2) + V1 \quad (16)$$

Figure 8E:
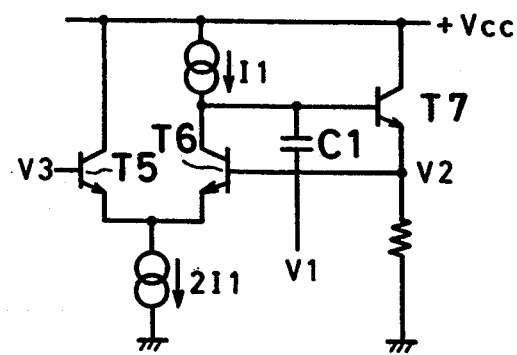

If a portion corresponding to FIG. 8D circuit is derived from FIG. 6, the portion can be illustrated as shown in FIG. 8E, and when both are compared with each other, the equation V0''=V2 can be established, and therefore, the following equation (17) can be obtained in accordance with the equation (16).

$$V2 = \frac{1}{2re1} \cdot \frac{1}{j\omega C1} \cdot (V3 - V2) + V1 \quad (17)$$

If the equation (17) is modified, the above described equation (9) is obtained.

Similar to the above, in connection with the differential pair constituted by the transistors T9 and T10, the above described equation (10) is obtainable in accordance with the same evaluating method. However, the differential resistor of the differential pair by the transistors T9 and T10 is re2.

In the equations (9) and (10), when V3 is eliminated by $j\omega = S$, the following equation (18) is obtainable.

$$S^2 \cdot 4re1re2 \cdot C1C2 \cdot V1 + S \cdot 2re2C2 \cdot V4 + V5$$
$$= (S^2 \cdot 4re1re2 \cdot C1C2 + S \cdot 2 \ re2C2 + 1)V2 \quad (18)$$

In the equation (18), by applying respective conditions as described later to respective values of V1, V2, V4 and V5, it is possible to vary a characteristic of the variable filter as shown in FIG. 6.

(Condition 1)

V1=V5=0, V4=Vin and V2=Vout

In this case, the above described equation (18) is modified as follows:

$$S \cdot 2re2C2 \cdot Vin = (S^2 \cdot 4re1re2 \cdot C1C2 + S \cdot 2re2C2 + 1) \cdot Vout$$
$$Vout/Vin = S \cdot 2re2C2/(S^2 4re1re2 \cdot C1C2 + S \cdot 2re2C2 + 1)$$

Since the following equation (24) is obtained, the following equation (19) is obtainable.

$$\omega o = (1/4re1re2 \cdot C1C2)^{1/2} = \frac{q}{2KT}(I1I2/C1C2)^{1/2} \quad (24)$$

Assuming that the Q is given as follows:

$$Q = (re1C1/re2C2)^{1/2} = (I2C1/I1C2)^{1/2} \quad (19)$$

$$Vout/Vin = S \cdot \frac{\omega o}{Q} / \left( S^2 + \frac{\omega o}{Q} \cdot S + \omega o^2 \right)$$

The equation (19) indicates a transfer function of a band-pass filter.

Therefore, when the above described condition 1 is satisfied, that is, when the terminals 15 and 19 are connected to ground in an alternating current and the terminals 18 and 16 are used as an input terminal and an output terminal of the variable filter 20, the variable filter 20 operates as a variable BPF.

In the equation (19), $\omega o$ is an oscillation angle frequency of the BPF, which is variable by changing the current amounts 211 and 212 of the constant current source circuits 11 and 13. In addition, Q indicates a sharpness of the filter, which is also variable by changing the current amounts 211 and 112. In other words, by controlling the current amounts I1 and I2, it is possible to vary a characteristic of the variable BPF.

(Condition 2)

V1=V5=Vin, V4=−Vin, and V2=Vout

In this case, in accordance with the above described equation (18), the following equation (20) is obtainable.

$$Vout/Vin = \left(S^2 - \frac{\omega o}{Q} \cdot S + \omega o^2\right) / \left(S^2 + \frac{\omega o}{Q} \cdot S + \omega o^2\right) \quad (20)$$

The equation (20) indicates a transfer function of an all-pass filter.

Therefore, when the above described condition 2 is satisfied, that is, when the terminals 15 and 19 are commonly used as an input terminal and a signal having a reverse polarity to an input signal is input to the terminal 18 and the terminal 16 is used as an output terminal, the variable filter 20 shown in FIG. 6 operates as a variable APF, and a characteristic thereof is dependent on the current amounts I1 and I2.

(Condition 3)

V1=V5=Vin, V4=0 and V2=Vout

In this case, in accordance with the above described equation (18), the following equation (21) is obtainable.

$$Vout/Vin = (S^2 + \omega o^2) / \left(S^2 + \frac{\omega o}{Q} \cdot S + \omega o^2\right) \quad (21)$$

The equation (21) indicates a transfer function of a band-elimination filter (BEF).

Therefore, when the above described condition 3 is satisfied, that is, when the terminals 15 and 19 are commonly used as an input terminal and the terminal 18 is connected to the ground in alternating current and the terminal 16 is used as an output terminal, the variable filter shown in FIG. 6 operates as a variable BEF, and a characteristic thereof is dependent on the current amounts I1 and I2.

(Condition 4)

V1=Vin, V4=V5=0 and V2=Vout

In this case, in accordance with the above described equation (18), the following equation (22) is obtainable.

$$Vout/Vin = \frac{\omega o}{Q} \cdot S^2 / \left(S^2 + \frac{\omega o}{Q} \cdot S + \omega o^2\right) \quad (22)$$

The equation (22) indicates a transfer function of a secondary high-pass filter (HPF).

Therefore, when the above described condition 4 is satisfied, that is, when the terminal 15 is used as an input terminal and the terminals 18 and 19 are connected to the ground in alternating current and the terminal 16 is used as an output terminal, the variable filter 20 operates as a variable HPF, and a characteristic thereof is dependent on the current amounts I1 and I2.

(Condition 5)

V1=V4=0, V5=Vin and V2=Vout

In this case, in accordance with the above described equation (18), the following equation (23) is obtainable.

$$Vout/Vin = \omega o^2 / \left(S^2 + \frac{\omega o}{Q} \cdot S + \omega o^2\right) \quad (23)$$

The equation (23) indicates a transfer function of a secondary low-pass filter (LPF).

Therefore, when the above described condition 5 is satisfied, that is, when the terminal 19 is used as an input terminal and the terminals 15 and 18 are connected to the ground in alternating current and the terminal 16 is used as an output terminal, the variable filter 20 operates as an LPF, and a characteristic thereof is dependent on the current amounts I1 and I2.

As described above, by applying the respective conditions without changing the circuit configuration, it is possible to operate the variable filter 20 as shown in FIG. 6 as a variable BPF or variable APF, and it is possible to control the characteristic of the filter by the current amounts I1 and I2.

Figure 7:
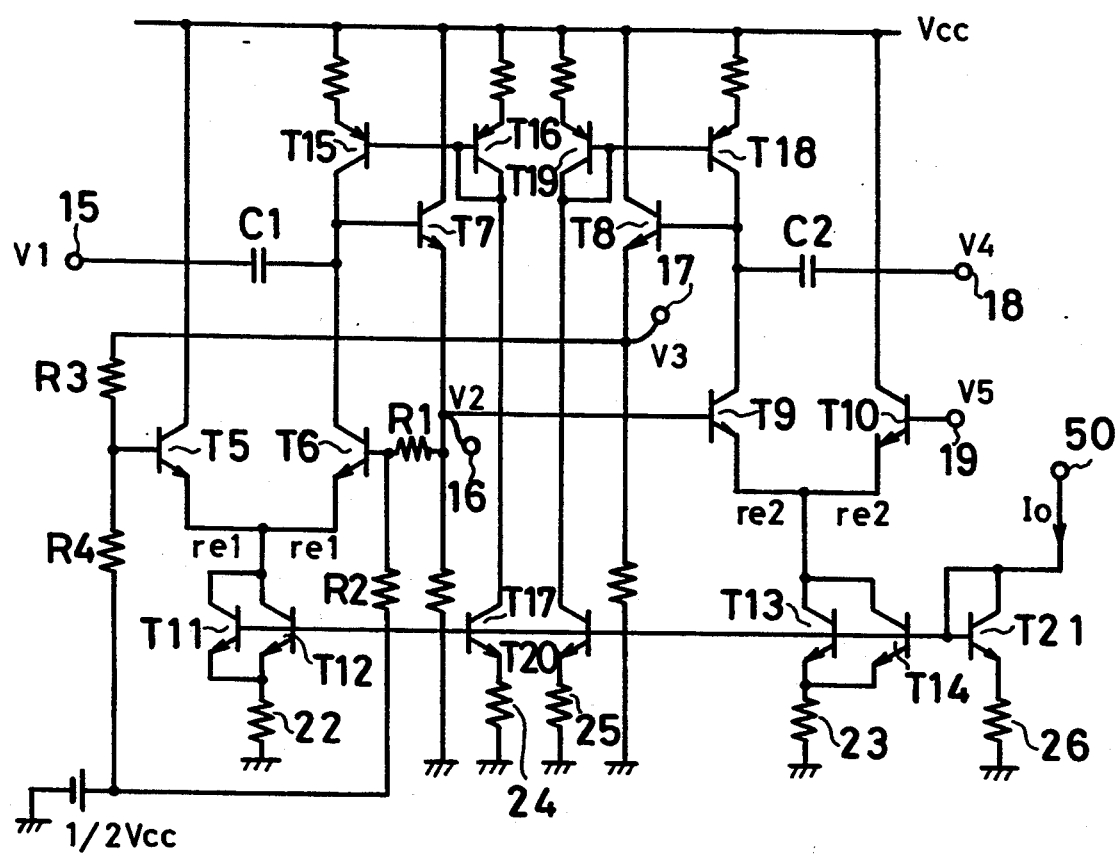
FIG. 7 is a circuit diagram specifically showing FIG. 6 circuit.

FIG. 7 is a circuit diagram showing a specific variable filter in which the current amounts I1 and I2 can be controlled by applying the principle of the variable filter 20 as shown in FIG. 6, wherein the constant current source circuits are constituted by current mirror circuits composed of transistors and resistors so that the current amounts of the constant current source circuits can be controlled in response to a current value of the control signal Io.

Next, the circuit as shown in FIG. 7 will be described briefly. In addition, by applying the same reference symbols to the same portions as that in FIG. 6, a duplicate description will be omitted.

The constant current source circuit 11 is constituted by transistors T11 and T12 connected in parallel with each other and a resistor 22 having a resistance value of r, and a control current signal Io, which is supplied to a terminal 50, is injected to a collector of a transistor T21 which constitutes a current mirror circuit along with the transistors T11 and T12. In addition, the constant current source circuit 13 is also constituted by transistors T13 and T14 connected in parallel with each other and a resistor 23 having a resistance value of r, and a current having the same current amount as the control current signal, which is injected to the collector of the transistor T21, flows into the transistors T13 and T14. Transistor T13 and T14 constitute a current mirror circuit along with the transistor T21.

The constant current source circuit 12 is replaced with a current mirror circuit constituted by transistors T15 and T16 and a constant current source circuit The constant current source circuit includes a transistor T17 coupled to the transistor T16 and a resistor 24 having a resistance value of 2r, and a current amount thereof is controlled by the control current signal which is injected into a collector of the transistor T21. Similarly, the constant current source circuit 14 is replaced with a current mirror circuit constituted by transistors T18 and T19 and a constant current source circuit having by a transistor T20 and a resistor 25 with a resistance value of 2r. A current amount thereof is controlled by the control current signal which is injected to a collector of the transistor T21.

On the assumption that a current amount flowing through the resistor 24 is i when the control current signal has an arbitrary current value Io, the current amounts flowing through the constant current source circuits 11, 12, 13 and 14, more specifically the current amounts flowing through the resistors 22, 23 and 25, are as follows: a current of 2i flows through the resistors 22 and 23, a current of i flows through the resistor 25, and a collector current of each of the transistors T15 and T18 also becomes i by an operation of the current mirror circuit. Therefore, I1=I2=i and, when a resistance value of a resistor R26 is 2r, Io=i=I1=I2. In addition, resistors R1, R2, R3 and R4 are inserted to set a gain. Furthermore, the resistors R2 and R4 are connected to the ground in alternating current, and it is necessary to apply thereto a direct current bias such as Vcc/2 when such a circuit is to be operated.

In the FIG. 7 circuit, assuming K=R2/(R1+R2) and L=R4/(R3+R4), if operations similar to the above described equation (9) and (10) are performed, the following equations (9') and (10') are established and, when V3 is eliminated, the following equation (18') is obtainable.

$$\frac{LV3 - KV2}{2re1} \cdot \frac{1}{j\omega C1} = V2 - V1 \quad (9')$$

$$\frac{V5 - V2}{2re2} \cdot \frac{1}{j\omega C2} = V3 - V4 \quad (10')$$

$$S^2 \cdot 4re1re2 \cdot C1C2 \cdot V1 + S \cdot 2re2C2 \cdot L \cdot V4 + L \cdot V5 = \quad (18')$$

$$(S^2 \cdot 4re1re2 \cdot C1C2 + S \cdot 2re2C2 \cdot K + L)V2$$

By applying the condition 1 to the equation (18'), the following equations are obtained.

$$Vout/Vin = S \cdot \frac{\omega 0'}{Q'} / \left( S^2 + \frac{\omega 0'}{Q'} \cdot S + \omega 0'^2 \right)$$

wherein, $$\omega 0' = (L/4re1re2 \cdot C1C2)^{1/2}$$

$$Q' = \frac{1}{K}(LI2C1/I1C2)^{1/2} = \frac{1}{K}(LC1/C2)^{1/2}$$

The above equation indicates a transfer function of the BPF.

In addition, when the condition 2 is applied to the above described equation (18'), the following equation is obtained.

$$Vout/Vin = \left( S^2 - \frac{\omega o'}{Q'} \cdot S + \omega o'^2 \right) / \left( S^2 + \frac{\omega o'}{Q'} \cdot S + \omega o'^2 \right)$$

The above equation indicates a transfer function of the APF.

Next, a description will be made of a voltage control oscillator (VCO) which is constituted by the variable filter 20 having the above described circuit configuration.

In order to apply the condition 1 to the variable filter 20, the terminals 15 and 19 are connected to the ground in alternating current, the terminal 18 is used as the input terminal which is supplied with the output of the amplifier 5, the terminal 16 is used as the output terminal which is coupled to the input of the amplifier 5, and an added current Io+Δi which is obtained by adding the current Io from the LPF 8 (FIG. 1) which is supplied to the terminal 50 (FIG. 7) as the control signal and a current Δi from the VCA 2 (see FIG. 1) (described later in detail), and then, the variable filter 20 (FIG. 6) operates as the variable BPF 4 (FIG. 1). By inserting the amplifier 5 between an input and an output of the BPF, the VCO 3 is constituted, and a frequency modulated signal F=Fo+Δf can be output.

In addition, the above described variable filter 20 receives as the control signal therefor not the voltage but the current, and therefore, it is preferable that such a circuit is represented as a current controlled oscillator. In practice, however, in this text, the circuit is represented as a voltage controlled oscillator (VCO) according to common usage because signals are generally sent and received between electronics equipment in the form of a voltage.

In addition, by applying the condition 2 to the variable filter 20, the terminals 15 and 16 are used as an input terminal which is supplied with a clock signal CK. The terminal 18 is supplied with a signal having a reverse polarity to the clock signal CK. The terminal 16 is used as the output terminal which is coupled to an input end of the phase comparator 7, and the terminal 50 is supplied with the current Io as the control signal. The variable filter 20 operates as the variable APF 6.

In accordance with the above described equation (24), in a case where the filter shown in FIG. 6 functions as the variable BPF, the oscillation angle frequency ωo is represented as follows:

$$\omega o = \frac{q}{2KT}(I1I2/C1C2)^{1/2}$$

when a circuit is designed to obtain conditions that C1=C2=C and that I1=I2=I, the oscillation frequency F of the variable BPF is given by the following equation (25).

$$F = 2\pi\omega o = 2\pi \cdot (q/2KT) \cdot (I/C) \quad (25)$$
$$= (\pi q/KT) \cdot (I/C)$$

Therefore, the oscillation frequency F is determined by the control current I, a capacitance value C of the capacitor and the absolute temperature T.

Dividing the equation (25) into the center frequency Fo and the frequency deviation amount Δf, the following equation (26) is obtainable.

$$F = Fo + \Delta f = 2\pi \cdot (q/2KT) \cdot (Io + \Delta i)/C \quad (26)$$
$$= (\pi q/KT) \cdot (Io/C) + (\pi q/KT) \cdot (\Delta i/C)$$

The control current Io is supplied from the Fo control circuit 1 which is an automatic correction circuit using the variable APF 6. Since the variable APF 6 and the variable BPF 4 are formed in the same monolithic IC with the same circuit configuration as described above, a resonant point of the variable BPF 4 is in proportion to the clock signal CK similar to that of the variable APF 6. Therefore, in a state where a frequency of the clock signal CK from the external is maintained at a constant value, the center frequency Fo also becomes a constant value. In addition, in accordance with the above described equation (26), since the equation $F_o = (\pi q/KT)\cdot(I_o/C)$ is established, the following equation (38) is obtainable.

$$I_o = F_o KTC/\pi q \tag{38}$$

Figure 5:
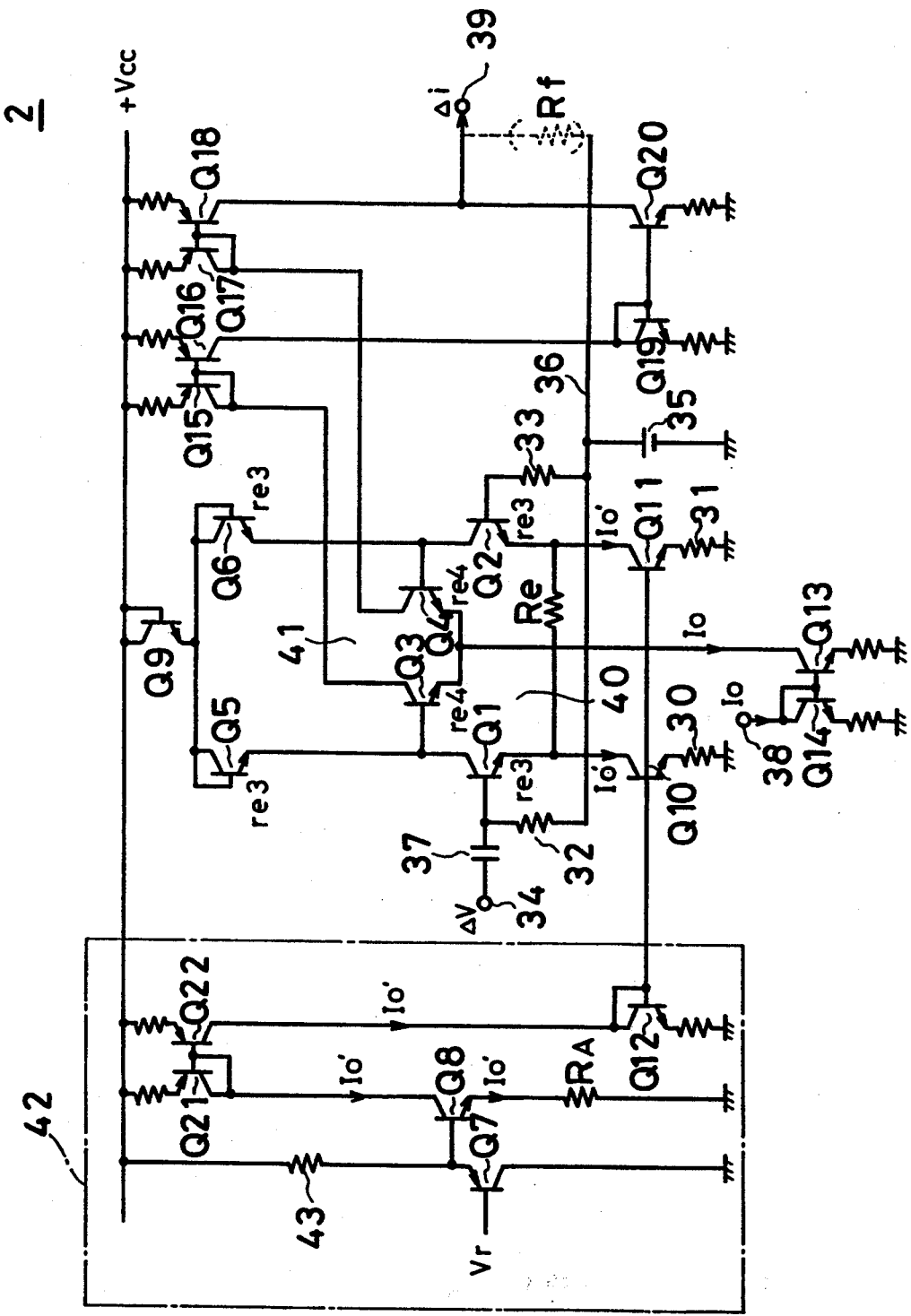
FIG. 5 is a circuit diagram showing a VCA and associated portions shown in FIG. 1.

Next, a specific circuit configuration of the VCA 2 is shown in FIG. 5. In addition, since all the elements of the block diagram of FIG. 2 are formed in the same monolithic IC, the VCA 2 is also formed in the same monolithic IC as similar to the variable BPF 4 and the variable APF 6.

The VCA 2 is mainly composed of a differential pair 40 which is constituted by a pair of NPN transistors Q1 and Q2 and arranged on the outside of a differential pair 41 which is coupled to the differential pair 40 in series and constituted by a pair of transistors Q3 and Q4 and arranged on the inside of the differential pair 40. Collectors of the transistors Q1 and Q2 are respectively coupled to bases of the transistors Q3 and Q4 and to emitters of NPN transistors Q5 and Q6 which are connected to each other in a diode fashion. In addition, a transistor Q9 is inserted between the collectors of the transistors Q5 and Q6 and a line for the voltage +Vcc.

On the other hand, emitters of the transistors Q1 and Q2 are each coupled to an end of a resistor Re and also to collectors of transistors Q10 and Q11, respectively.

The transistors Q10 and Q11 are transistors which constitute a constant current source circuit along with respective resistors 30 and 31, and respective bases thereof are coupled to a base of a transistor Q12 constituting a bias circuit 42 (described later) which in turn forms a current mirror circuit.

Bases of the transistors Q1 and Q2 are coupled through resistors 32 and 33 to a line 36 which is biased at a predetermined voltage by a direct current voltage source 35. The base of the transistor Q1 is further connected to an input terminal 34 for inputting the modulation signal Δv through a capacitor 37 for cutting-off a direct current component.

Emitters of the transistors Q3 and Q4 are coupled to a collector of a transistor Q13 which constitutes a current mirror circuit along with a transistor Q14. In addition, a collector of the transistor Q14 is coupled to an input terminal 38 which is supplied with an output current Io of the Fo control circuit 1. On the other hand, collectors of the transistors Q3 and Q4 are coupled to collectors and bases of transistors Q15 and Q17. Transistors Q15 and Q17 constitute current mirror circuits along with transistors Q16 and Q18, respectively. A collector of the transistor Q16 is coupled to a collector and a base of a transistor Q19 which constitutes a current mirror circuit along with a transistor Q20. A collector of the transistor Q18 is coupled to a collector of the transistor Q20 and an output terminal 39.

The bias circuit 42 includes a PNP transistor Q7 having a base supplied with a fixed reference voltage Vr, an emitter connected to a voltage source line through a resistor 43, and a collector connected to the ground. The emitter of the transistor Q7 is coupled to a base of an NPN transistor Q8 having a collector coupled to a collector and a base of a transistor Q21. Bases of the transistor Q21 and a transistor Q22 are coupled to each other to constitute a current mirror circuit. A collector of the transistor Q22 is coupled to a collector and a base of a transistor Q12. In addition, a resistor $R_A$ is inserted between an emitter of the transistor Q8 and the ground, and a base of the transistor Q12 is coupled to the bases of the transistors Q10 and Q11 as described above to constitute a current mirror circuit.

Next, a description will be made on an operation of the VCA 2 having the above described circuit configuration. First, in the bias circuit 42, since the transistor Q7 is a PNP type and the transistor Q8 is an NPN type, and both the transistors are formed in the same monolithic IC, if a base-emitter voltage of the transistor Q7 is $V_{BE}$, a base-emitter voltage of the transistor Q8 becomes $-V_{BE}$ which has the same absolute value and a reverse polarity as that of $V_{BE}$. Therefore, since both the base-emitter voltages are canceled with each other, the emitter voltage of the transistor Q8 becomes the reference voltage Vr and a current Io' flowing through the resistor $R_A$ is represented by the following equation (35).

$$I_o' = V_r/R_A \tag{35}$$

The current Io' is equal to a collector current of the transistor Q8. According to a current mirror effect of the transistors Q21 and Q22, a collector current of the transistor Q12 is also equal to the current Io'. Further, according to a current mirror effect of the transistors Q10, Q11 and Q12, a collector current of each of the transistors Q10 and Q11 also becomes Io'.

On the other hand, when the output current Io from the Fo control circuit 1 is supplied to the input terminal 38, according to a current mirror effect of the transistors Q14 and Q13, a collector current of the transistor Q13 also become Io. Next, a description will be made on the gain of each of the differential pair when the differential pairs 40 and 41 operate in this state.

A gain of a differential pair is generally given by dividing a collector resistor (load) of transistors constituting the differential pair by an emitter resistor (load), that is, the collector resistor/the emitter resistor. Then, noting the differential pair 40, an input voltage is the modulation signal Δv and an output voltage is the collector voltages of the transistors Q1 and Q2 (respective collector voltages have reverse polarities relative to each other). Assuming that a differential resistor of the differential pair 40 is re3, an emitter load becomes $2re3 + R_E$. In addition, since each of the emitter currents of the transistors Q5 and Q6 is equal to Io', a differential resistor of the transistors Q5 and Q6 is equal to re3, and since the differential resistor of the transistors Q5 and Q6 serves as the collector load of the differential pair 40, a voltage gain A1 of the differential pair 40 with respect to the input voltage and output voltage is given by the following equations (27).

$$A1 = re3/(2re3 + R_E) \tag{27}$$

where, $$re3 = (1/I_o')\cdot(KT/g) \tag{33}$$

Then, the deferential resistor re3 is much smaller than the resistor $R_E$, that is, a relationship of $re3 << R_E$ is obtained. Therefore, the above described equation (27) is modified as follows:

$$A1 = re3/R_E \tag{28}$$

Next, noting the differential pair 41, an input voltage is equal to each of the collector voltages of the transistors Q1 and Q2 which is the output voltage of the differential pair 40. An output voltage is a voltage generated between the output terminal 39 and the line 36. Thus if a load resistor Rf is inserted between the output terminal 39 and the line 36 as shown by a dotted line in FIG. 5, the output voltage becomes equal to a voltage generated between both ends of the load resistor Rf. Assuming that a differential resistor of the differential pair 41 is re4, an emitter load becomes 2re4.

On the other hand, the transistors Q3 and Q4 function as a push-pull circuit, and therefore, a collector current of the transistor Q3 becomes the collector current of the transistor Q19 according to a current mirror effect of the transistors Q15 and Q16. Further, according to a current mirror effect of the transistors Q19 and Q20, the collector current of the transistor Q3 becomes a collector current of the transistor Q20. In addition, a collector current of the transistor Q4 becomes a collector current of the transistor Q18 according to a current mirror effect of the transistors Q17 and Q18. When the collector current of the transistor Q4 increases, the collector current of the transistor Q3 decreases, and the collector current of the transistor Q18 becomes larger than the collector current of the transistor Q20. Thus, a current amount due to an increase of the collector current of the transistor Q20 is output as an output current $\Delta i$. In reverse, when the collector current of the transistor Q3 increases, the collector current of the transistor Q4 decreases. The collector current of the transistor Q18 becomes smaller than the collector current of the transistor Q20, and thus, a current amount for compensating a decrease of the collector current of the transistor Q20 flows into the terminal 39 inversely. Therefore, the load resistor Rf contributes to the collector load of the transistors Q3 and Q4, and therefore, the collector load of the differential pair 41 becomes 2Rf.

Then, a voltage gain A2 of the differential pair 41 is given by the following equation (29).

$$A2 = 2Rf/2re4 = Rf/re4 \qquad (29)$$

where, $$re4 = (1/Io) \cdot (KT/q) \qquad (30)$$

Since the output voltage is Rf·$\Delta i$, in accordance with the equation (29), a gain A3 of voltage-current (V-I) conversion in the differential pair 41 is given by the following equation (31).

$$A3 = A2/Rf = (Rf/re4)/Rf = 1/re4 \qquad (31)$$

Then, the VCA 2 of the embodiment shown is actually a V-I converter of a current controlled gain type, and therefore, a gain A of the V-I converter is a product of a voltage gain A1 by the V-I gain A3, and therefore, represented by the following equation (32).

$$A = \Delta i/\Delta v = A1 \cdot A3 = (re3/R_E) \cdot (1/re4) \qquad (32)$$

Furthermore, if the equations (33) and (30) are substituted for the equation (32), the following equation (34) is obtainable.

$$A = (1/Io') \cdot (KT/q)/\{R_E \cdot (1/Io) \cdot (KT/q)\} \qquad (34)$$
$$= Io/(Io' \cdot R_E)$$

In addition, if the equation (35) is substituted for the equation (34), the following equation (36) is obtainable.

$$\Delta i/\Delta v = Io/\{(Vr/R_A) \cdot R_E\}$$

$$a i = \Delta v \cdot Io/\{Vr \cdot (R_E/R_A)\} \qquad (34)$$

Since the relative accuracy of resistors is very good in a monolithic IC, $R_E/R_A$ becomes a constant value. Since the reference voltage Vr is also a constant voltage, it is possible to consider the equation $1/\{Vr \cdot (RE/RA)\} = m$ (m is a constant value). Therefore, the above described equation (36) is represented by the following equation (37).

$$\Delta i = m \cdot Io \cdot v \qquad (37)$$

In accordance with the equation (26), the following equation (39) is obtainable, and therefore, if the equations (38) and (37) are substituted for the equation (39), the following equation (40) is obtainable.

$$\Delta f = (\pi q/KT)(\Delta i/C) \qquad (39)$$

$$\Delta f = (\pi q/KT) \cdot (m \cdot Io \cdot \Delta v/C) = m \cdot Fo \cdot \Delta v \qquad (40)$$

By constructing the VCA 2 as shown in FIG. 5 and setting m to be coincident with a target value, a frequency modulated signal having a frequency deviation amount $\Delta f$ which is not dependent upon variations of capacitors of VCO and a temperature drift thereof can be output.

In other words, in a case where a temperature dependency exists in an oscillation frequency as represented by the above described equation (25), as represented by the equation (26), the center frequency Fo as well as a frequency deviation amount $\Delta f$ are dependent on a temperature. However, in accordance with the embodiment shown, it becomes unnecessary to apply an adjustment that takes into consideration such a temperature dependency to the input of the VCO.

As described above, the output of the VCO 3 having no temperature dependency becomes one input of the phase comparing circuit 61, which is phase-compared with the FM input signal being the other input to the phase comparing circuit 61. The output of the phase comparing circuit 61 is input to the LPF 62 to derive only the low-frequency components to be outputted as the sound signal $\Delta v$ being frequency-demodulated. The demodulated sound signal is fed-back to the VCA 2 as described above as a signal for adjusting a demodulating level, and the same is supplied to the hold circuit 70 via the switch 100.

In order to suppress spike noises when changing two rotational video heads, the hold circuit 70 holds a demodulated signal obtained immediately before the timing of the head changing and plays a role in performing a holding process to hold a previous output so that a held signal is output during a period when the noises will be generated in changing the video heads. Specifically, the hold circuit 70 is constituted by an operational amplifier 71 and a capacitor 72.

More specifically, a capacitor 72 is inserted between a + side input terminal of the operational amplifier 71 to which the demodulated sound signal is input. An output terminal of the operational amplifier 71 is coupled to a − side input terminal through a negative feedback loop. As a result, the alternating current input impedance of the + side input terminal becomes very large. Therefore, a charge/discharge is repeated in the capacitor 72 in response to the demodulated sound signal. During a period when the demodulated sound signal is supplied thereto, the demodulated sound signal is output from the operational amplifier 71 as is, but if the supply of the demodulated sound signal is cut-off by an opened state of the switch 100, a held value, (i.e. a charged voltage of the capacitor 72 immediately before a timing when the switch 100 is opened) is applied to the + side input terminal. Therefore, when the demodulated sound signal is dropped-out, an output of the operational amplifier 71 is compensated for by the level held by the capacitor 72. The output of the operational amplifier 71 is supplied to a speaker (not shown) or the like as a sound output.

Next, a description will be made on a monostable multivibrator 90 which controls the open or close of the switch 100. In addition, in the monostable multivibrator 90, by applying the same reference symbols to the same portions as that of FIG. 2 conventional example, a duplicate description will be omitted here. The monostable multivibrator 90 is different from the monostable multivibrator 101 as shown in FIG. 2 in that a constant current source circuit 91 is inserted between the power source voltage line and the + side input terminal of the comparator 103 in place of the resistor 105 and that the − side input terminal of the comparator 103 is coupled to a connection point of a plurality of diodes 92a, 92b and 92c and a resistor 93 being connected in series between the power source voltage line and the ground.

The constant current source circuit 91 specifically has a circuit configuration as shown in FIG. 4. More specifically, in the constant current source circuit 91, transistors 110 and 111 are connected in series between the power source voltage line and the ground. A transistor 112 constitutes a current mirror circuit along with the transistor 111. A parallel connection of n transistors TR1, TR2, ..., TRn is connected in series between the power source voltage line and the ground. These transistors TR1, TR2, ..., TRn constitute a current mirror circuit along with a transistor 113. Resistors 114 and 115 which have the same resistance value are inserted between emitters of the transistors 111 and 112 and the ground. A resistor 116 having a resistance value of r/n is inserted between emitters of the transistors TR1, TR2, ..., TRn and the power source voltage line. Between an emitter of the transistor 113 and the power source voltage line, a resistor 117 having a resistance value of r is inserted. A collector of the transistor 113 is connected to a terminal 118 which is coupled to the + side input terminal of the comparator 103.

On the other hand, an output voltage of the LPF 8 composed of a resistor 8a and a capacitor 8b is applied to a base of a transistor 120 where transistors 120 where and 121 are connected in series between the power source voltage line and ground. On the assumption that the output voltage value of the LPF 8 is Vx and the resistance value of a resistor 122 being inserted between an emitter of the transistor 120 and the ground is Rx, a collector current of the transistor 120 becomes Vx/Rx=Io which is supplied to respective circuits of subsequent stages as an output current of the LPF 8.

More specifically, by connecting the transistor 121 connected in series to the transistor 120 and the transistor 110 to constitute a current mirror circuit, the collector current of the transistor 110 becomes Io, and a collector current of the transistor 113 becomes Io/n (n is the number of the transistors TR1, TR2, ..., TRn being connected in parallel with each other). Thus, the transfer ratio becomes 1/n. The collector current of the transistor 113 becomes a current Ia which flows into the terminal 118 and represented by the following equation (300).

$$Ia = Io/n \tag{300}$$

Then, if the equation (38) is substituted for the equation (300), the following equation (301) is obtainable.

$$Ia = FoKTC/n = q \tag{301}$$

Meanwhile, in the charge/discharge circuit composed of the constant current source circuit 91 and the capacitor 106, the equation $Q = Cvr = \int Ia dt$ is generally established, and a charge time of the capacitor 106 is a time period $\tau$, a metastable period of the monostable multivibrator 90 itself. As a result, the following equation (302) is also established.

$$\tau = C \cdot Vr/Ia$$

The voltage Vr is the reference voltage which is applied to the − side input terminal of the comparator 103.

When the equation (301) is substituted for the equation (302), the following equation (303) is obtainable.

$$\tau = C \cdot Vr/(FoKTC/n\pi q) = Vr/(FoKT/n\pi q) \tag{303}$$

If $FoKT/n\pi q = j$ (j is a constant value) is set, the following equation (304) is obtained.

$$\pi = Vr/j \tag{304}$$

Therefore, it is possible to obtain a pulse width with a high-accuracy while the time period $\tau$ thereof is not dependent on a capacitance value of the capacitor 106.

In addition, although j ($=FoKT/n\pi q$) is dependent on T, (e.g. the absolute temperature, it is possible to simply cancel such a dependency by inserting the diodes 92a, 92b, ... each having a temperature coefficient, (e.g. temperature dependency substantially equal to that of the constant j between the − side input terminal of the comparator 103 and the power source voltage line in setting the reference voltage Vr.

In addition, the capacitance value of the capacitor 106 of this embodiment shown is set to be equal to a capacitance value of each of the capacitors C1 and C2 of the variable APF as shown in FIG. 7. However, the capacitance value of the capacitor 106 may not be the same as that of the capacitors C1 and C2. More specifically, if all the circuit components shown in FIG. 1 are formed in the same monolithic IC and the current Io is set to be a current amount in proportion to the capacitors of the monolithic IC, since the relative accuracy of the capacitors within the same monolithic IC is very high, j becomes a constant value which is not dependent on absolute capacitance values of the capacitors. Therefore, the metastable period of the monostable multivibrator 90 is also not dependent on the capacitance value of the capacitor 106.

An output of the monostable multivibrator thus having a high-accuracy metastable period $\tau$, (i.e., non-inverted output of the RS-FF 102) is used as a control signal for opening or closing the switch 100 so that at every leading edges and trailing edge of the RF-SW pulses, the switch 100 is opened only for that time period. Thus, by outputting a held value which is held immediately before a timing when the video head is changed in place of the demodulated sound signal for only the time period τ after the change of the heads, it is possible to prevent the changing noise generated during the time period τ from being output as the sound output. In addition, after laps of the time period τ, in the low level period of the monostable multivibrator 90 until the next leading edge or the next trailing edge, the switch 100 is brought in the closed state, Thus the demodulated sound signal from the PLL FM demodulating circuit 60 is output from the sampling hold circuit 70 as the sound output in a real time.

In addition, in FIG. 4, the transistor 123 which constitutes a current mirror circuit along with the transistor 121 is a transistor for injecting the current Io into the variable APF6. The current Io is injected into a terminal 50 as shown in FIG. 7 as the control current signal. Furthermore, in order to supply the current Io to the variable BPF 4, by coupling a transistor to constitute a current mirror circuit along with the transistor 121, it is possible to simply withdraw the current Io.

Thus, the relative accuracy of the capacitors within the same monolithic IC is very good and it is possible to transfer a current with a high-accuracy by a current mirror effect within the monolithic IC. Therefore, it is possible to set a metastable period which is not dependent on the capacitance value of the capacitor.

Figure 9:
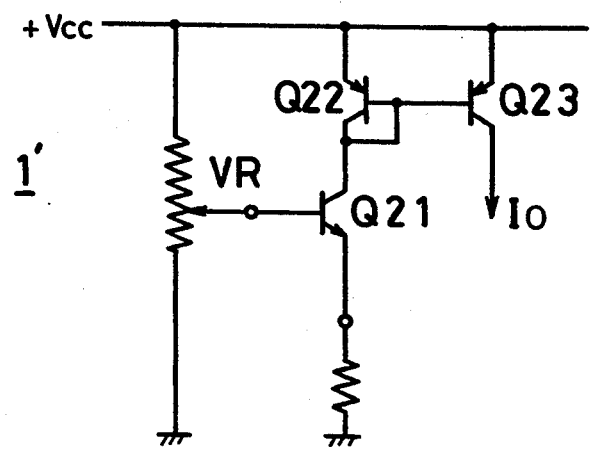
FIG. 9 is a circuit diagram showing another embodiment of a center frequency control circuit.

In the above described embodiment, the center frequency control circuit 1 of an adjustment free type is utilized. However, a center frequency control circuit 1' as shown in FIG. 9 may be used. The center frequency control circuit 1' of FIG. 9 embodiment includes a variable resistor VR and a voltage of the variable resistor VR applied to a base of a transistor Q21. The transistor Q21 constitutes a conversion circuit and converts the output voltage of the variable resistor VR into a current. Then, an emitter resistor is connected to an emitter of the transistor Q21 and a collector thereof is connected to the power source voltage +Vcc through a transistor Q22. The transistor Q22 constitutes a current mirror circuit along with a transistor Q23. Therefore, the output voltage of the variable resistor VR is converted into the control current Io.

More specifically, when the variable resistor VR is adjusted and the transistor Q21 is turned on by the output voltage thereof, an emitter current determined by the emitter resistor flows through the transistor Q21. The emitter current is in proportion to the output voltage of the variable resistor VR. Then, in a transistor circuit, generally, an emitter current and a collector current are equal to each other, and therefore, a current in proportion to the output voltage of the variable resistor VR flows in the transistor Q21, (i.e., through the transistor Q22. Since the transistors Q22 and Q23 constitute the current mirror circuit, the same current as that of the transistor Q22 flows through the transistor Q23. An output current of the transistor Q23 may be given to the VCO 3 as shown in FIG. 1 as the control current Io.

In addition, in the above described embodiments, a description was made on a monolithic IC in which a monostable multivibrator and a VCO are formed. However, a monostable multivibrator in accordance with the present invention may be formed in a monolithic IC along with another arbitral circuit having a capacitor. In such a case, the charge current of the capacitor 106 is controlled in response to the level of the control signal for controlling a characteristic dependent on a capacitance value of the capacitor of that circuit.

Although the present invention has been described and illustrated in detail, it is clearly understood that such details are only illustration and examples of and not limitations upon the present invention. The spirit and scope of the present invention is limited only by the terms of the appended claims.

What is claimed is:

1. A monostable multivibrator incorporated in a single integrated circuit with a) a variable frequency oscillator having a center frequency which is controlled by a first current and b) a control means, said monostable multivibrator comprising:

a capacitor charged by a second current;

comparing means, operatively coupled to said capacitor, for comparing a charged voltage of said capacitor and a reference voltage to output a charge stop signal when said charged voltage reaches said reference voltage, charge stopping means for stopping a charging of said capacitor with said charge stop signal;

current control means for controlling said first current and said second current in response to a common control signal output by the control means.

2. A monostable multivibrator formed in a monolithic integrated circuit with and operatively coupled to a first capacitor circuit including a first capacitor which is controlled by a control signal from a control circuit so as to determine a frequency characteristic of said first capacitor circuit based upon said first capacitor, said monostable multivibrator comprising:

a current source outputting a controllable amount of current;

a second capacitor having an input end connected to an output of said current source;

charge starting means, connected to the input end of said second capacitor, for starting a charging of said second capacitor with a current from said current source in response to a trigger signal;

charge stopping means, connected to the input end of said second capacitor, for detecting a charged voltage of said second capacitor and for stopping the charging of said second capacitor when said charged voltage of said second capacitor reaches a predetermined value; and current control means for controlling an amount of the current from said current source in response to the control signal from the control circuit, wherein a metastable period of said monostable multivibrator determined from a) a timing that said charging of said second capacitor is started by said charge starting means and b) a timing that said charging of said second capacitor is stopped by said charge stopping means, said metastable period is controlled by said control circuit in accordance with said frequency characteristic of said first capacitor circuit.

3. A monostable multivibrator in accordance with claim 2, wherein said charge starting means and said charge stopping means include a single flip-flop which is brought into a first state in response to the trigger signal and into a second state when the charged voltage of said second capacitor reaches a predetermined value, such that a time during when the flip-flop is in the first state is said metastable period of said monostable multivibrator.

4. A monostable multivibrator in accordance with claim 3, wherein said current source includes a current path connected to said second capacitor, and said current control means includes means for changing a current amount flowing through the current path in response to the control signal.

5. A monostable multivibrator in accordance with claim 4, wherein said current control means includes a current mirror circuit operatively connected to said current source so as to be incorporated in the current path between said current source and said second capacitor.

6. A monolithic integrated circuit, comprising:
a variable frequency oscillator including a filter, a center frequency of said variable frequency oscillator being determined by at least an amount of a first current flowing in said filter;
control means, operatively connected to a control input of said variable frequency oscillator, for applying a control signal that determines the amount of said first current; and
a monostable multivibrator, connected to said control means so as to receive the control signal, said monostable multivibrator including
a current source outputting a second current,
a capacitor having an input end connected to an output of the current source,
charge starting means, connected to the input end of the capacitor, for starting a charging of the capacitor with the second current from the current source in response to a trigger signal,
charge stopping means, connected to the input end of the capacitor, for detecting a charged voltage of the capacitor and for stopping the charging of the capacitor when the charged voltage of the capacitor reaches a predetermined value, and
current control means for controlling an amount of the second current from the current source in response to a level of the control signal from said control means
wherein a metastable period of said monostable multivibrator determined from a) a timing that the charging of the capacitor is started by the charge starting means and b) a timing that the charging of the capacitor is stopped by the charge stopping means, and said metastable period controlled by said control means based upon the center frequency of the variable frequency oscillator.

7. A monolithic integrated circuit, comprising:
a first circuit including a first capacitor, the first capacitor having at least one predetermined charge level;
control means, operatively connected to said first circuit, for applying a control signal to said first circuit so as to control the predetermined charge level of the first capacitor; and
a monostable multivibrator connected to said control means for receiving the control signal, said monostable multivibrator including
a current source,
a second capacitor having an input end connected to an output of the current source,
charge starting means, connected to the input end of the second capacitor, for starting a charging of the second capacitor with a current from the current source in response to a trigger signal,
charge stopping means, connected to a signal input of the charge starting means, for stopping the charging of the second capacitor when a charged voltage of the second capacitor reaches a predetermined value, and
current control means, connected to the current source, for controlling an amount of the current from the current source in response to a level of the control signal from said control means.

* * * * *